United States Patent
Noh et al.

(10) Patent No.: US 10,644,219 B2
(45) Date of Patent: May 5, 2020

(54) PIEZOELECTRIC VIBRATION MODULE

(71) Applicant: WISOL CO., LTD., Osan-si, Gyeonggi-do (KR)

(72) Inventors: Jung Rae Noh, Osan-si (KR); Jae Hyung Choi, Suwon-si (KR); Yo Sep Choi, Osan-si (KR)

(73) Assignee: WISOL CO., LTD., Osan-si, Gyeonggi-Do (KR)

(*) Notice: Subject to any disclaimer, the term of this patent is extended or adjusted under 35 U.S.C. 154(b) by 331 days.

(21) Appl. No.: 15/578,472

(22) PCT Filed: Jun. 2, 2016

(86) PCT No.: PCT/KR2016/005846
§ 371 (c)(1),
(2) Date: Nov. 30, 2017

(87) PCT Pub. No.: WO2016/200094
PCT Pub. Date: Dec. 15, 2016

(65) Prior Publication Data
US 2018/0175274 A1  Jun. 21, 2018

(30) Foreign Application Priority Data
Jun. 11, 2015 (KR) .................. 10-2015-0082491

(51) Int. Cl.
*H01L 41/113* (2006.01)
*H01L 41/04* (2006.01)
(Continued)

(52) U.S. Cl.
CPC .......... *H01L 41/042* (2013.01); *H01L 41/094* (2013.01); *H02N 2/04* (2013.01);
(Continued)

(58) Field of Classification Search
None
See application file for complete search history.

(56) References Cited

U.S. PATENT DOCUMENTS

2004/0075363 A1* 4/2004 Malkin ............... H01L 41/1136
                                                310/321
2005/0253486 A1* 11/2005 Schmidt ............. H01L 41/1136
                                                310/329

(Continued)

FOREIGN PATENT DOCUMENTS

JP   05-189733 A   7/1993
JP   11-019591 A   1/1999
(Continued)

OTHER PUBLICATIONS

Search Report, dated Sep. 12, 2016, for International Application No. PCT/KR2016/005846.

(Continued)

*Primary Examiner* — J. San Martin
(74) *Attorney, Agent, or Firm* — LRK Patent Law Firm

(57) ABSTRACT

A piezoelectric vibration module includes a vibration plate adapted to have one end fixed and the other end not fixed and driven in a vertical direction based on the fixed first end, a first piezoelectric element attached to the top or bottom of the vibration plate and adapted to generate a vibration power when power is applied, and a weight formed in the other end of the top or bottom of the vibration plate and adapted to control the vibration frequency of the piezoelectric vibration module. The first piezoelectric element is attached to the top or bottom of the vibration plate with a predetermined interval from a fixed point at the one end of the vibration plate.

7 Claims, 3 Drawing Sheets

(51) Int. Cl.
*H01L 41/09* (2006.01)
*H02N 2/04* (2006.01)
*H05K 1/18* (2006.01)

(52) U.S. Cl.
CPC ......... *H05K 1/189* (2013.01); *H05K 2201/05* (2013.01); *H05K 2201/10068* (2013.01); *H05K 2203/0292* (2013.01)

(56) References Cited

U.S. PATENT DOCUMENTS

| | | | | |
|---|---|---|---|---|
| 2007/0114890 | A1* | 5/2007 | Churchill | H01L 41/1136 310/339 |
| 2007/0125176 | A1* | 6/2007 | Liu | H01L 41/1136 73/649 |
| 2008/0277941 | A1* | 11/2008 | Bowles | E21B 41/0085 290/54 |
| 2009/0315431 | A1* | 12/2009 | Rastegar | H01L 41/1136 310/331 |
| 2010/0072759 | A1* | 3/2010 | Andosca | H01L 41/1136 290/1 R |
| 2011/0140579 | A1* | 6/2011 | Moon | H01L 41/1136 310/339 |
| 2012/0126666 | A1* | 5/2012 | Tabata | H02N 2/181 310/319 |
| 2013/0082569 | A1* | 4/2013 | Hirabayashi | H01L 41/1136 310/319 |
| 2014/0062389 | A1* | 3/2014 | Ide | H02J 5/00 320/107 |
| 2015/0303835 | A1* | 10/2015 | Katsumura | H01L 41/1136 310/329 |

FOREIGN PATENT DOCUMENTS

| | | |
|---|---|---|
| JP | 2002-171341 A | 6/2002 |
| JP | 2011-152004 A | 8/2011 |
| KR | 10-1016208 B1 | 2/2011 |

OTHER PUBLICATIONS

Written Opinion, dated Sep. 12, 2016, for International Application No. PCT/KR2016/005846.

* cited by examiner

| NO. | D/L comparison (%) | Frequency (Hz) | Vibration acceleration (G) | Phenomenon in which adhesives between piezoelectric element and vibration plate fall apart | Drop reliability |
|---|---|---|---|---|---|
| 1 | 0.0 | 230 | 0.78 | NG | NG |
| 2 | 0.6 | 226 | 0.76 | NG | NG |
| 3 | 1.2 | 221 | 0.75 | NG | NG |
| 4 | 1.8 | 217 | 0.74 | NG | NG |
| 5 | 2.4 | 212 | 0.72 | OK | NG |
| 6 | 3.0 | 208 | 0.70 | OK | OK |
| 7 | 3.6 | 198 | 0.69 | OK | OK |
| 8 | 4.2 | 190 | 0.67 | OK | OK |
| 9 | 4.8 | 182 | 0.65 | OK | OK |
| 10 | 5.4 | 171 | 0.62 | OK | OK |
| 11 | 6.0 | 159 | 0.59 | OK | OK |

PIEZOELECTRIC VIBRATION MODULE

CROSS-REFERENCE TO RELATED APPLICATIONS

The present application is a U.S. National Phase entry from International Application No. PCT/KR2016/005846, filed Jun. 2, 2016, which claims priority to Korean Patent Application No. 10-2015-0082491, filed Jun. 11, 2015, the disclosure of which is incorporated by reference herein in its entirety.

BACKGROUND OF THE INVENTION

1. Technical Field

The present invention relates to a piezoelectric vibration module including a vibration plate adapted to have one end fixed and the other end not fixed and driven in a vertical direction based on the fixed one end, a first piezoelectric element attached to the top or bottom of the vibration plate and adapted to generate a vibration power when power is applied, and a weight formed in the other end of the top or bottom of the vibration plate and adapted to control the vibration frequency of the piezoelectric vibration module, wherein the first piezoelectric element is attached to the top or bottom of the vibration plate with a predetermined interval from a fixed point at the one end of the vibration plate.

2. Description of Related Art

A piezoelectric element refers to an element having the property that it generates electric polarization due to a potential difference or generates a physical deformation or stress when an external force is applied thereto. Recently, such a piezoelectric element is widely used in portable electronic devices, such as a smart terminal, a mobile phone, a tablet PC and a game machine, in order to utilize a vibration function.

In particular, recently, mutual conversion between mechanical vibration energy and electric energy is made possible, and thus piezoelectric ceramics, that is, materials of high conversion efficiency, is used as the piezoelectric element. The piezoelectric ceramics has an advantage of a rapid response speed because it is used in a piezoelectric actuator and a piezoelectric speaker and also has an advantage in that it is widely used in a wearable device, a mobile phone, and various electronic devices because the piezoelectric ceramics is driven with low power/low voltage. Accordingly, active research is carried out on the piezoelectric element using piezoelectric ceramics.

However, the piezoelectric ceramics has a disadvantage in that it may be damaged by stress generated while a normal product is driven in addition to an impact attributable to the drop of the product because it has strong brittleness that the piezoelectric ceramics is easily broken by an external force by the basic nature of ceramic. Accordingly, there is a need to minimize stress generated during the normal operation of a product in order to prevent damage to or a breakdown of the piezoelectric element.

SUMMARY OF THE INVENTION

The present invention has been made to solve the aforementioned problems of the existing piezoelectric vibration module, and an object of the present invention is to provide a piezoelectric vibration module in which a piezoelectric element is attached to a vibration plate with a predetermined interval from a fixing member in order to secure the best location for preventing damage attributable to generated stress.

Technical objects to be achieved by the present invention are not limited to the aforementioned object, and may include various technological objects evident to those skilled in the art from the following description.

A piezoelectric vibration module according to an embodiment of the present invention includes a vibration plate adapted to have one end fixed and the other end not fixed and driven in a vertical direction based on the fixed first end, a first piezoelectric element attached to the top or bottom of the vibration plate and adapted to generate a vibration power when power is applied, and a weight formed in the other end of the top or bottom of the vibration plate and adapted to control the vibration frequency of the piezoelectric vibration module. The first piezoelectric element is attached to the top or bottom of the vibration plate with a predetermined interval from a fixed point at the one end of the vibration plate.

Furthermore, the piezoelectric vibration module according to an embodiment of the present invention further includes a second piezoelectric element attached to the opposite side of the first piezoelectric element based on the vibration plate and adapted to generate a vibration power when power is applied. The second piezoelectric element is attached to one side of the vibration plate with a predetermined interval from a fixed point at the one end of the vibration plate.

In this case, the piezoelectric vibration module according to an embodiment of the present invention further includes a fixing member formed in a flexible circuit board capable of applying external power to the piezoelectric vibration module or at the one end of the top or bottom of the vibration plate and adapted to fix the one end.

Furthermore, in the piezoelectric vibration module according to an embodiment of the present invention, if the first piezoelectric element or the second piezoelectric element is attached to the bottom or bottom of the vibration plate with an interval from the fixing member, they are attached with an interval corresponding a length of 3% to 6% of the length of the piezoelectric vibration module.

Furthermore, in the piezoelectric vibration module according to an embodiment of the present invention, the first piezoelectric element or the second piezoelectric element has a thickness of 0.4 mm or less and has a single sheet form or a stack form.

Furthermore, in the piezoelectric vibration module according to an embodiment of the present invention, a vibration frequency is 200 Hz or less, and the first piezoelectric element or the second piezoelectric element is a piezoelectric ceramic element.

Furthermore, in the piezoelectric vibration module according to an embodiment of the present invention, if the first piezoelectric element or the second piezoelectric element is attached to the vibration plate, the interval between the piezoelectric element and the vibration plate is 5 μm to 30 μm.

Advantageous Effects

The present invention has been made to solve the problems of the existing piezoelectric vibration module as described above, and has an effect in that when the piezoelectric element is attached to the vibration plate, they are coupled at the best location for preventing damage attributable to generated stress because the piezoelectric element and the vibration plate are attached with a predetermined interval from the fixing member.

Furthermore, in accordance with the embodiments of the present invention, when the piezoelectric element included in the piezoelectric vibration module is attached to the vibration plate, a vibration frequency is adjusted to 200 Hz or less through the selection of the best location, thereby providing a smooth touch when vibration is generated.

Furthermore, the present invention has an effect in that it can enhance the adhesive force of the vibration plate and improve drop reliability through the selection of the best location of the piezoelectric element within a limited range.

Furthermore, in accordance with the embodiments of the present invention, a vibration frequency and vibration acceleration suitable for a product can be effectively controlled through control of the location of the piezoelectric element.

DETAILED DESCRIPTION

Hereinafter, "piezoelectric vibration modules" according to embodiments of the present invention are described in detail with reference to the accompanying drawings. The embodiments to be described hereunder are provided in order for those skilled in the art to easily understand the technological spirit of the present invention, and the present invention is not restricted by the embodiments. Furthermore, contents expressed in the accompanying drawings have been diagrammed to easily describe the embodiments of the present invention, and may be different from those that are actually implemented.

Elements to be described herein are only examples for implementing the embodiments of the present invention. Accordingly, in other implementations of the present invention, different elements may be used without departing from the spirit and range of protection of the present invention.

Furthermore, an expression that some elements are "included" is an expression of an "open type", and the expression simply denotes that the corresponding elements are present, but should not be construed as excluding an additional element.

Furthermore, expressions, such as "the first" and "the second", are used to only distinguish between a plurality of elements and do not limit the sequence or other characteristics of the elements.

Figure 1:
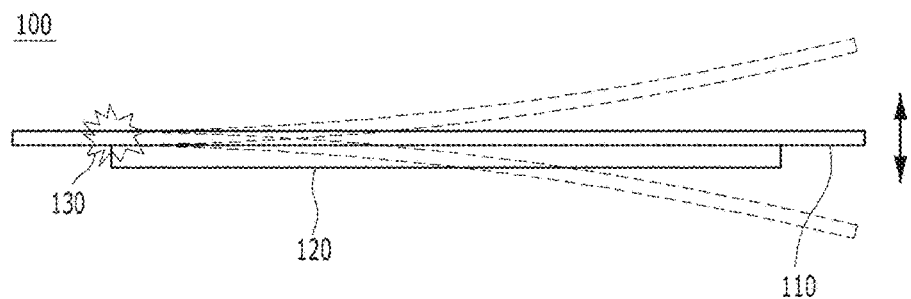
FIG. 1 is an exemplary diagram showing the generation of stress in a conventional piezoelectric vibration module.

FIG. 1 is an exemplary diagram showing the generation of stress in a conventional piezoelectric vibration module.

Referring to FIG. 1, the conventional piezoelectric vibration module 100 may include a vibration plate 110 and a piezoelectric element 120. In this case, the piezoelectric element is attached to the vibration plate and provides various types of vibration, such as expansion/contraction and up/down/left/right motions, when external power is applied thereto.

Furthermore, the conventional piezoelectric vibration module is widely used in a smart terminal, an electronic device, and a mobile device. When a user drops the terminal or the electronic device, an impact is applied to the piezoelectric vibration module. Furthermore, strong stress is generated in a portion 130 where the piezoelectric element 120 and the vibration plate 110 are coupled because stress is generated while a user commonly uses a corresponding product.

Stress refers to resistance generated within materials in response to the size of an external force when the external force, such as compression, tension, bending or twisting, is applied to the materials. Such stress increases as the external force increases, but when the stress reaches a limit unique to the materials, the materials are broken because the materials cannot withstand the external force.

Accordingly, when such an impact or stress is generated in the piezoelectric vibration module, an interval is generated in the portion where the piezoelectric element 120 and the vibration plate 110 are coupled or adhesion between the piezoelectric element 120 and the vibration plate 110 falls apart, thus becoming a direct cause of a reduction in the stability of the vibration frequency of the piezoelectric vibration module. Furthermore, when stress is generated, a phenomenon in which the piezoelectric element 120 itself is broken or cracked may occur.

Figure 2:
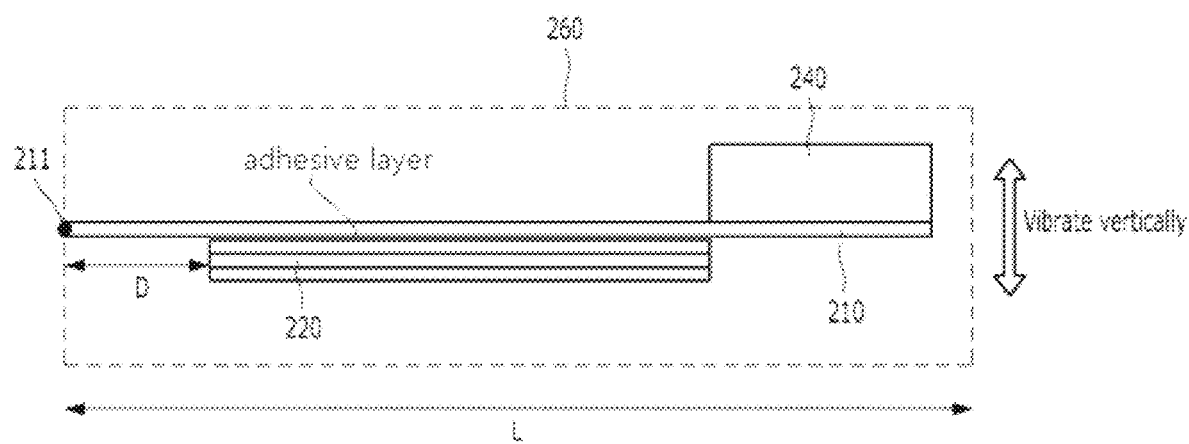
FIG. 2 is a block diagram showing the state in which the piezoelectric element of a piezoelectric vibration module including the casing of the piezoelectric vibration module according to an embodiment of the present invention has been attached to the bottom of a vibration plate with a specific interval from a fixed one end.

FIG. 2 is a block diagram showing the state in which the piezoelectric element of a piezoelectric vibration module including the casing of the piezoelectric vibration module according to an embodiment of the present invention has been attached to the bottom of a vibration plate with a specific interval from a fixed one end.

Referring to FIG. 2, the piezoelectric vibration module 200 according to an embodiment of the present invention may include a vibration plate 210, a first piezoelectric element 220, a weight 240 and a piezoelectric vibration module casing 260.

The piezoelectric element has been attached to the vibration plate 210. When power is applied to the attached piezoelectric element to generate a vibration power, the vibration plate 210 may be driven in all the directions capable of vibration, such as up or down or left or right, along with the piezoelectric element. In this case, the attachment of the piezoelectric element and the vibration plate may be performed using adhesives or may be performed using all of attachable materials, such as an adhesive tape, an adhesive bond or an adhesive film. Furthermore, an adhesion thickness between the piezoelectric element and the vibration plate may be about 5~30 um.

Furthermore, the vibration plate 210 has one end fixed (211) and the other end not fixed. In this case, the fixed point 211 may be fixed to one side of the piezoelectric vibration module casing 260 as shown in FIGS. 2 and 3.

The first piezoelectric element 220 is attached to the bottom of the vibration plate and generates a vibration power when power is applied thereto. In this case, a flexible circuit board (not shown) is connected to the piezoelectric element. When external power is applied to the piezoelectric vibration module, the piezoelectric element can generate a vibration power.

Figure 3:
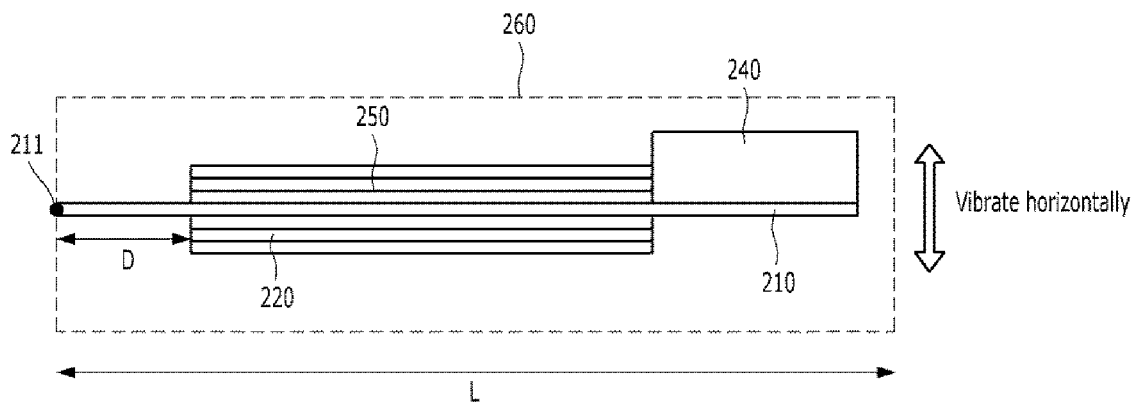
FIG. 3 is a block diagram showing the state in which the piezoelectric element of a piezoelectric vibration module including the casing of the piezoelectric vibration module according to an embodiment of the present invention has been attached to the top and bottom of the vibration plate with a specific interval from the fixed one end.

FIG. 3 is a diagram showing a piezoelectric vibration module according to another embodiment of the present invention.

Referring to FIG. 3, the piezoelectric vibration module according to another embodiment of the present invention includes a first piezoelectric element 220 and a second piezoelectric element 250 attached to the bottom and top of the vibration plate, respectively.

Referring to FIGS. 2 and 3, the piezoelectric vibration module according to embodiments of the present invention may be configured in a unimorph type in which the piezoelectric element is attached to the top or bottom of the vibration plate or a bimorph type in which the piezoelectric element is attached to both the top and bottom of the vibration plate.

Furthermore, the first piezoelectric element 220 or the second piezoelectric element 250 may have a single sheet form in which the number of piezoelectric bodies is one or a stack form in which a plurality of piezoelectric bodies is stacked. The piezoelectric element may have a thickness of 0.4 mm or less which can improve a vibration frequency or vibration power. Furthermore, the piezoelectric element may be formed of a piezoelectric ceramic element, but may be made of all of materials having a piezoelectric characteristic, including lead zirconate titanate (PZT).

Furthermore, the first piezoelectric element or the second piezoelectric element may be attached to the top or bottom of the vibration plate with a specific interval from the fixed point 211 at one end of the vibration plate in the vibration plate having one end fixed (211). The interval from the fixed point and detailed contents thereof are described with reference to FIG. 6.

Figure 4:
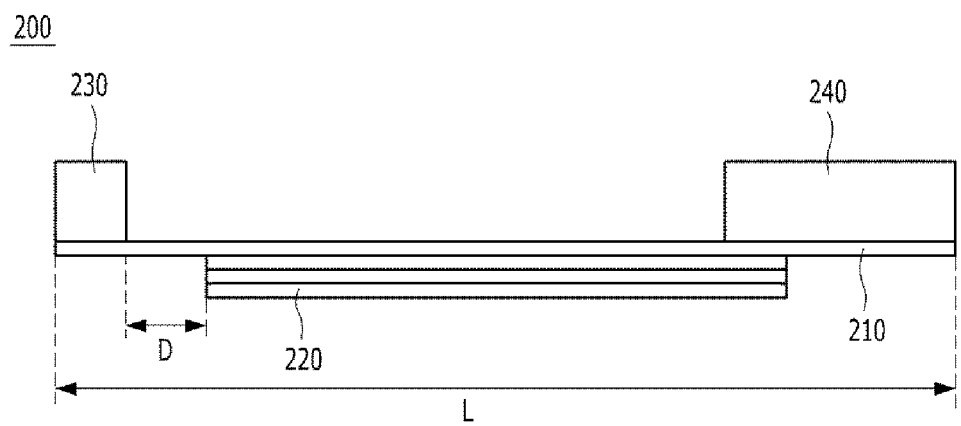
FIG. 4 is a block diagram showing the state in which the piezoelectric element of the piezoelectric vibration module according to an embodiment of the present invention has been attached to the bottom of the vibration plate with a specific interval from the fixing member.
Figures 5, 6:
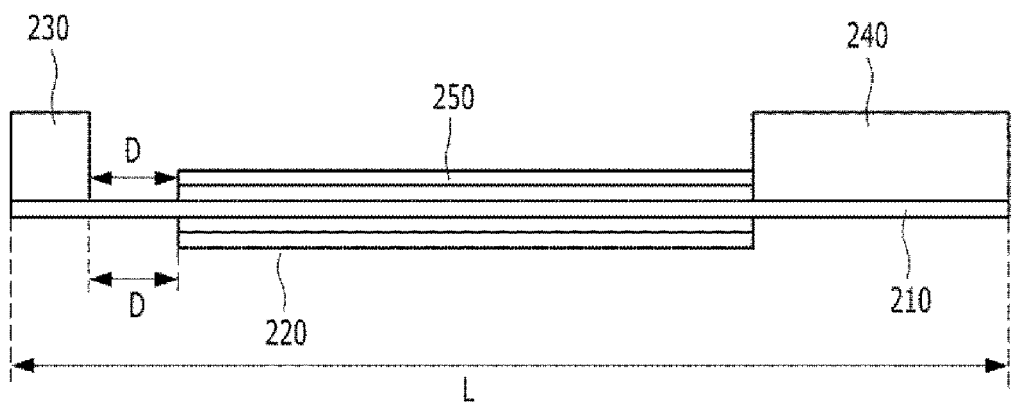
FIG. 5 is a block diagram showing the state in which the piezoelectric element of the piezoelectric vibration module according to an embodiment of the present invention has been attached to the top and bottom of the vibration plate with a specific interval from the fixing member.
FIG. 6 is an experiment tables showing a change of an adhesive force and drop reliability according to the distance if the piezoelectric element of the piezoelectric vibration module according to an embodiment of the present invention is attached to the vibration plate with a specific interval from a fixed point.

The piezoelectric vibration module according to another embodiment of the present invention, as shown in FIGS. 4 and 5, may further include a fixing member 230. The piezoelectric vibration module according to an embodiment of the present invention may have one end fixed to one side of the piezoelectric vibration module casing with the fixed point without a separate fixing member, but may further include a separate fixing member in order to further effectively control the vibration of the vibration plate.

The fixing member 230 is formed at one end of the top or bottom of the vibration plate, and fixes the one end of the vibration plate to not move. Accordingly, the vibration plate 210 according to an embodiment of the present invention does not move because it has one end fixed, and may have the other end move in various directions, such as up/down/left/right, because it has the other end not fixed.

The weight 240 is formed at the other end of the top or bottom of the vibration plate, and may control the vibration frequency of the vibration plate. In this case, the vibration frequency may be adjusted 200 Hz or less. As the size and weight of the weight increases, a vibration power increases.

FIG. 6 is an experiment tables showing a change of an adhesive force and drop reliability according to the distance if the piezoelectric element of the piezoelectric vibration module according to an embodiment of the present invention is attached to the vibration plate with a specific interval from a fixed point.

Referring to FIG. 6, the piezoelectric element (i.e., the first piezoelectric element or the second piezoelectric element) according to an embodiment of the present invention is attached to the top or bottom of the vibration plate with a predetermined interval from the fixing member, and thus is different in vibration frequency/vibration acceleration/adhesive falling phenomenon/drop reliability.

First, if the interval D between the fixed point 211 or the fixing member 230 and the piezoelectric element is gradually increased up to 0.0%~6.0% at intervals of 0.6% according to the ratio of the distance D and the length L of the piezoelectric vibration module or the length L of the vibration plate, the vibration frequency and vibration acceleration are gradually decreased whenever the interval D is increased. For example, in the case of the piezoelectric vibration module of FIGS. 2 and 3, the ratio of the interval D between the fixed point 211 and the piezoelectric element and the length L of the piezoelectric vibration module may be controlled. In the case of the piezoelectric vibration module of FIGS. 4 and 5, the ratio of the interval D between the fixing member 230 and the piezoelectric element and the length L of the vibration plate may be controlled.

In this case, referring to FIG. 6, when the comparison interval % is 0.0%~1.8% or less, a phenomenon in which adhesives between the piezoelectric element and the vibration plate fall apart is generated. When the comparison interval % is 2.4% or more, the piezoelectric element and the vibration plate can be stably attached.

Furthermore, drop reliability can be measured depending on the comparison interval %. The drop reliability is measured in a jig having a height of 1.5 m and weight of 200 g. The drop reliability is measured by performing a total of 24 times of a 6-side drop experiment every four times. If there is no change in a corresponding product when the product is dropped 24 times, the product is determined to have drop reliability.

From FIG. 6, it may be seen that drop reliability measured according to the comparison interval % was guaranteed when the comparison interval was 3.0% or more. In this case, a case where there is no change in a product satisfies at least one of a case where a change of electric characteristics before and after a drop is ±20% or less, a case where a change of mechanical characteristics before and after a drop is ±20% or less, a case where there is no structural change in the product before and after a drop, and a case where there is a change of a specific level or less.

Accordingly, if the first piezoelectric element or the second piezoelectric element according to an embodiment of the present invention is attached to the bottom or top of the vibration plate with an interval from the fixing member, a length interval corresponding to a specific ratio of the piezoelectric vibration module or the vibration plate or a predetermined length may be set between the first piezoelectric element or the second piezoelectric element and the bottom or top of the vibration plate in order to prevent the phenomenon in which adhesives fall apart and in terms of drop reliability. In this case, the specific ratio may be a length corresponding to 3% to 6% in the ratio of D/L. Furthermore, the predetermined length may be determined by taking into consideration the length of the vibration module or the total length of the vibration plate.

The aforementioned embodiments of the present invention have been disclosed for illustrative purposes, and the present invention is not restricted by the embodiments. Furthermore, those skilled in the art to which the present invention pertains may modify and change the present invention in various ways within the spirit and range of the present invention, and such modifications and changes should be construed as belonging to the scope of the present invention.

What is claimed is:

1. A piezoelectric vibration module comprising:
a vibration plate adapted to have a first end fixed and a second end not fixed and driven in a vertical direction based on the fixed first end;
a first piezoelectric element attached to a top or bottom of the vibration plate and adapted to vibrate when power is applied; and
a weight formed in the second end of the top or bottom of the vibration plate and adapted to control a vibration frequency of the piezoelectric vibration module,
wherein the first piezoelectric element is attached to the top or bottom of the vibration plate with a predetermined interval from a fixed point or a fixing member at the first end of the vibration plate, and
wherein the interval is within a range of 3% to 6% of a length of the piezoelectric vibration module.

2. The piezoelectric vibration module of claim 1, further comprising:
a second piezoelectric element attached to an opposite side of the first piezoelectric element with respect to the vibration plate and adapted to vibrate when power is applied,
wherein the second piezoelectric element is attached to one side of the vibration plate with the interval from the fixed point or the fixing member at the first end of the vibration plate.

3. The piezoelectric vibration module of claim 2, wherein the first piezoelectric element or the second piezoelectric element has a thickness of 0.4 mm or less.

4. The piezoelectric vibration module of claim 2, wherein an interval between the first piezoelectric element or the second piezoelectric element and the vibration plate is 5 μm to 30 μm by an adhesive layer therebetween.

5. The piezoelectric vibration module of claim 2, wherein the first piezoelectric element or the second piezoelectric element has a single sheet form or a stack form.

6. The piezoelectric vibration module of claim 2, wherein the vibration frequency is 200 Hz or less.

7. The piezoelectric vibration module of claim 2, wherein the first piezoelectric element or the second piezoelectric element comprises a piezoelectric ceramic element.

* * * * *